United States Patent
Ise et al.

(10) Patent No.: US 10,497,445 B2
(45) Date of Patent: Dec. 3, 2019

(54) MEMORY CONTROL CIRCUIT, MEMORY, AND MEMORY CONTROL METHOD

(71) Applicant: FUJITSU LIMITED, Kawasaki-shi, Kanagawa (JP)

(72) Inventors: Masahiro Ise, Machida (JP); Masazumi Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/037,385

(22) Filed: Jul. 17, 2018

(65) Prior Publication Data
US 2019/0035469 A1    Jan. 31, 2019

(30) Foreign Application Priority Data
Jul. 25, 2017    (JP) .................... 2017-143315

(51) Int. Cl.
| | |
|---|---|
| G11C 7/00 | (2006.01) |
| G11C 16/10 | (2006.01) |
| G11C 11/56 | (2006.01) |
| G11C 7/10 | (2006.01) |
| G11C 16/34 | (2006.01) |

(52) U.S. Cl.
CPC .......... *G11C 16/10* (2013.01); *G11C 7/1006* (2013.01); *G11C 7/1051* (2013.01); *G11C 7/1096* (2013.01); *G11C 11/5628* (2013.01); *G11C 16/3495* (2013.01); *G11C 2207/06* (2013.01); *G11C 2207/22* (2013.01)

(58) Field of Classification Search
CPC ... G11C 16/10; G11C 16/3495; G11C 7/1006; G11C 7/1096; G11C 7/1051; G11C 11/5628; G11C 2207/22; G11C 2207/06
See application file for complete search history.

(56) References Cited

U.S. PATENT DOCUMENTS

| | | | | |
|---|---|---|---|---|
| 2010/0254613 A1* | 10/2010 | Wu | .................... | G06F 16/90344 382/217 |
| 2013/0278823 A1* | 10/2013 | Kobayashi | ........... | H04N 7/0102 348/441 |
| 2015/0286892 A1* | 10/2015 | Ohno | .................... | G06F 16/583 382/170 |

FOREIGN PATENT DOCUMENTS

| | | |
|---|---|---|
| JP | 2005-157781 | 6/2005 |
| JP | 2012-133831 | 7/2012 |

* cited by examiner

*Primary Examiner* — Mohammed A Bashar
(74) *Attorney, Agent, or Firm* — Fujitsu Patent Center

(57) ABSTRACT

A memory control circuit includes an input circuit that receives data to be written to a storage having multiple nonvolatile memory cells, and a control circuit, when a second number of bits that are included in a first bit string and having a first number of bits and have a second logical value different from a first logical value equal to initial values stored in the multiple nonvolatile memory cells is equal to or smaller than a first threshold, writes the first bit string and the first additional value to the storage, and that associates, when the second number of the bits is larger than a second threshold larger than the first threshold, a second bit string obtained by reversing logical values of all the bits of the first bit string with a second additional value and writes the second bit string and the second additional value to the storage.

9 Claims, 11 Drawing Sheets

FIG. 1
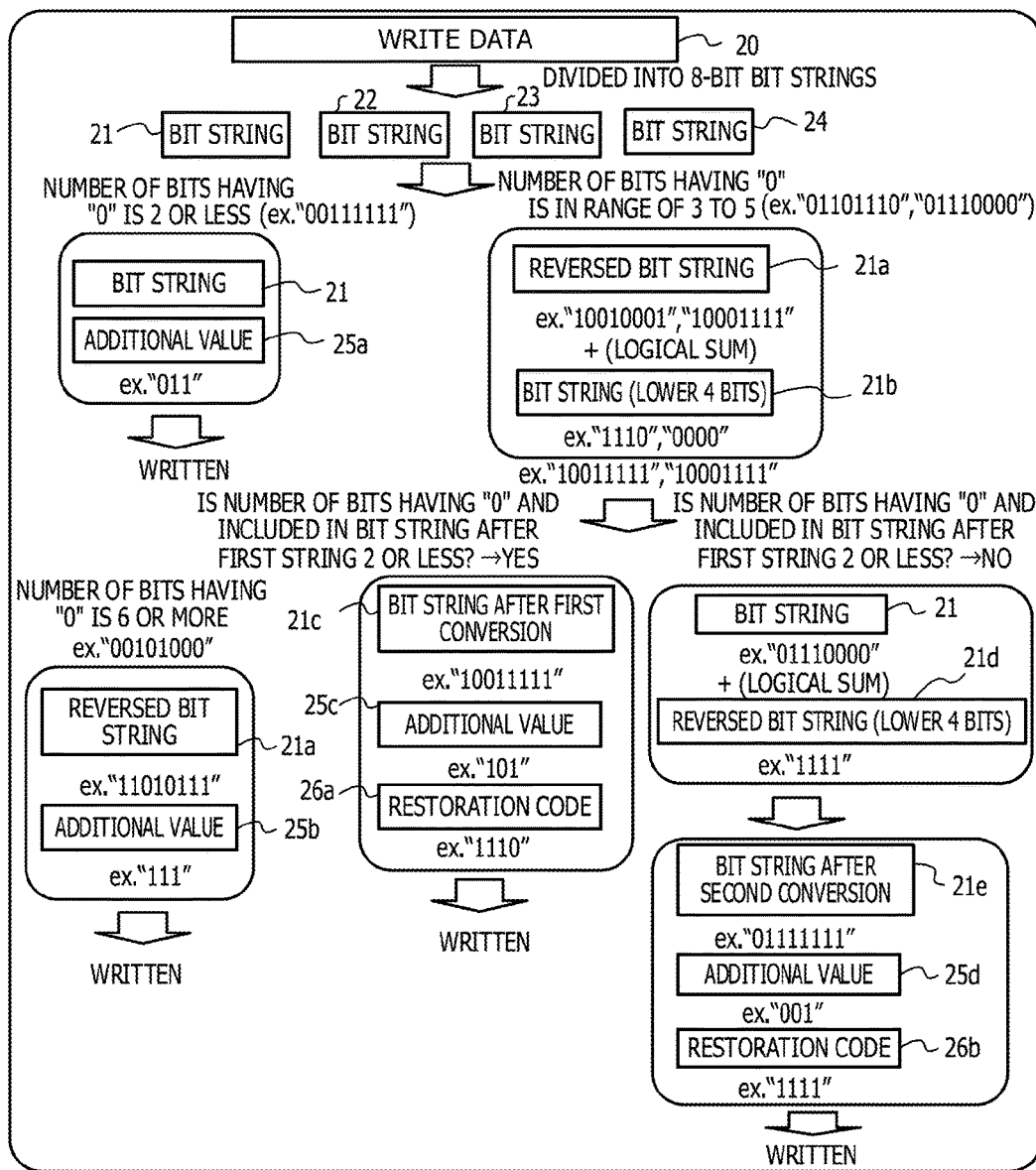
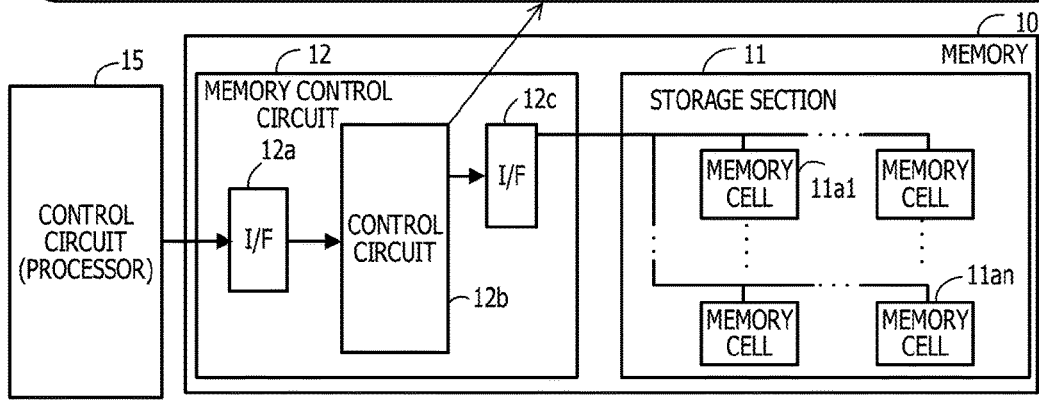

FIG. 5

| NUMBER OF BITS HAVING "0" | APPLIED CONVERSION PROCESS | ADDITIONAL VALUE (3 BITS) | RESTORATION CODE (4 BITS) | NUMBER OF BITS HAVING "0" AND INCLUDED IN DATA TO BE ACTUALLY WRITTEN |
|---|---|---|---|---|
| 0 | UNCONVERTED | 011 | UNUSED (ALL BITS HAVING "1") | 1 |
| 1 | UNCONVERTED | 011 | UNUSED (ALL BITS HAVING "1") | 2 |
| 2 | UNCONVERTED | 011 | UNUSED (ALL BITS HAVING "1") | 3 |
| 6 | PROCESS OF REVERSING ALL BITS | 111 | UNUSED (ALL BITS HAVING "1") | 2 |
| 7 | PROCESS OF REVERSING ALL BITS | 111 | UNUSED (ALL BITS HAVING "1") | 1 |
| 8 | PROCESS OF REVERSING ALL BITS | 111 | UNUSED (ALL BITS HAVING "1") | 0 |
| 3 | REVERSED BIT STRING + LOWER 4 BITS OF ORIGINAL BIT STRING (GENERATION OF BIT STRING AFTER FIRST CONVERSION) | 101 | LOWER 4 BITS OF ORIGINAL BIT STRING | 6 BITS OR LESS |
| 4 | REVERSED BIT STRING + LOWER 4 BITS OF ORIGINAL BIT STRING (GENERATION OF BIT STRING AFTER FIRST CONVERSION) | 101 | LOWER 4 BITS OF ORIGINAL BIT STRING | 6 BITS OR LESS |
| 5 | REVERSED BIT STRING + LOWER 4 BITS OF ORIGINAL BIT STRING (GENERATION OF BIT STRING AFTER FIRST CONVERSION) | 101 | LOWER 4 BITS OF ORIGINAL BIT STRING | 6 BITS OR LESS |
| 3 | ORIGINAL BIT STRING + LOWER 4 BITS OF REVERSED BIT STRING (IN CASE WHERE NUMBER OF BITS HAVING "0" AND INCLUDED IN BIT STRING AFTER FIRST CONVERSION IS 3 OR MORE) | 001 | NUMBER OF BITS HAVING "0" AND INCLUDED IN DATA TO BE ACTUALLY WRITTEN | 5 BITS OR LESS |
| 4 | ORIGINAL BIT STRING + LOWER 4 BITS OF REVERSED BIT STRING (IN CASE WHERE NUMBER OF BITS HAVING "0" AND INCLUDED IN BIT STRING AFTER FIRST CONVERSION IS 3 OR MORE) | 001 | NUMBER OF BITS HAVING "0" AND INCLUDED IN DATA TO BE ACTUALLY WRITTEN | 5 BITS OR LESS |
| 5 | ORIGINAL BIT STRING + LOWER 4 BITS OF REVERSED BIT STRING (IN CASE WHERE NUMBER OF BITS HAVING "0" AND INCLUDED IN BIT STRING AFTER FIRST CONVERSION IS 3 OR MORE) | 001 | NUMBER OF BITS HAVING "0" AND INCLUDED IN DATA TO BE ACTUALLY WRITTEN | 5 BITS OR LESS |

FIG. 6

| ORIGINAL BIT STRING | BIT STRING TO BE ACTUALLY WRITTEN | ADDITIONAL VALUE | RESTORATION CODE | NUMBER OF BITS HAVING "0" AND INCLUDED IN DATA TO BE ACTUALLY WRITTEN | RATIO |
|---|---|---|---|---|---|
| 00000000 | 11111111 | 111 | 111 | 0 | 0 |
| 00000001 | 11111110 | 111 | 111 | 1 | 0.067 |
| 00000010 | 11111101 | 111 | 111 | 1 | 0.067 |
| ... | ... | ... | ... | ... | ... |
| 00000111 | 11111111 | 101 | 0111 | 2 | 0.133 |
| ... | ... | ... | ... | ... | ... |
| 01111000 | 01111111 | 011 | 0111 | 4 | 0.267 |
| ... | ... | ... | ... | ... | ... |
| 11111111 | 11111111 | 011 | 1111 | 1 | 0.067 |

FIG. 7

| COMBINATION | PROCESS 1 | PROCESS 2 | PROCESS 3 | PROCESS 4 |
|---|---|---|---|---|
| No.1 | 011 | 111 | 101 | 001 |
| No.2 | 110 | 111 | 101 | 001 |
| No.3 | 101 | 111 | 011 | 001 |
| No.4 | 101 | 111 | 110 | 001 |
| No.5 | 011 | 111 | 101 | 100 |
| ⋮ | ⋮ | ⋮ | ⋮ | ⋮ |

MEMORY CONTROL CIRCUIT, MEMORY, AND MEMORY CONTROL METHOD

CROSS-REFERENCE TO RELATED APPLICATION

This application is based upon and claims the benefit of priority of the prior Japanese Patent Application No. 2017-143315, filed on Jul. 25, 2017, the entire contents of which are incorporated herein by reference.

FIELD

The embodiments discussed herein are related to a memory control circuit, a memory, and a memory control method.

BACKGROUND

A process of writing to a nonvolatile memory such as a flash memory is executed by reversing a first logical value of any of memory cells in a state (deletion state) in which the memory cells hold the first logical value to a second logical value based on write data. For example, in a flash memory, a writing process is executed by reversing a logical value "1" of any of memory cells in the deletion state in which the memory cells hold the logical value "1" to a logical value "0" based on write data.

It takes time to write the logical value "0" to a flash memory, since a floating gate of a memory cell of the flash memory is gradually charged with electrons in the writing of the logical value "0". Thus, there is a conventional technique for reversing all bits of write data and writing the data to memory cells in the case where a large number of bits having the logical value "0" are included in the write data.

In the conventional technique for reversing all bits of write data, however, the ratio of the number of bits having the logical value "0" and included in the write data to be written to a flash memory to the number of all bits of the write data is not lower than 50% in the worst case, and it may take long time to write the data. In not only the flash memory but also another type of nonvolatile memory, as the number of bits to be reversed from logical values in the deletion state is larger, a writing time period is longer.

The following is a reference document.
[Document 1] Japanese Laid-open Patent Publication No. 2005-157781.

SUMMARY

According to an aspect of the invention, a memory control circuit includes an input circuit that receives data to be written to a storage having multiple nonvolatile memory cells, and a control circuit that associates, when a second number of bits that are included in a first bit string included in the data and having a first number of bits and have a second logical value different from a first logical value equal to initial values stored in the multiple nonvolatile memory cells is equal to or smaller than a first threshold, the first bit string with a first additional value and writes the first bit string and the first additional value to the storage, that associates, when the second number of the bits is larger than a second threshold larger than the first threshold, a second bit string obtained by reversing logical values of all the bits of the first bit string with a second additional value and writes the second bit string and the second additional value to the storage, that generates, when the second number of the bits is larger than the first threshold and smaller than the second threshold, a fourth bit string by calculating a logical sum of the second bit string and a third bit string having half of all the bits of the first bit string, that associates, when a third number of bits included in the fourth bit string and having the second logical value is equal to or smaller than the first threshold, the fourth bit string, a third additional value, and the third bit string with each other and writes the fourth bit string, the third additional value, and the third bit string to the storage, that generates, when the third number of the bits is larger than the first threshold, a sixth bit string by calculating a logical sum of the first bit string and a fifth bit string having bits included in the second bit string and located at positions corresponding to the third bit string, and that associates the sixth bit string, a fourth additional value, and the fifth bit string with each other and writes the sixth bit string, the fourth additional value, and the fifth bit string to the storage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram illustrating an example of a memory according to a first embodiment and a memory control circuit;

FIG. 5 is a diagram illustrating an example of conversion processes, additional values, and restoration codes that are applied based on the numbers of bits having a logical value "0", and the numbers of bits having the logical value "0" and included in data to be actually written;

FIG. 6 is a diagram illustrating an example of the number of bits having the logical value "0" and included in data to be actually written after a conversion process and the result of calculating the ratio of the number of the bits having the logical value "0" and included in the data to the number of all bits of the data for each of all data patterns of an 8-bit bit string;

FIG. 7 is a diagram illustrating an example of multiple combinations able be used as additional values;

DESCRIPTION OF EMBODIMENTS

Figure 2:
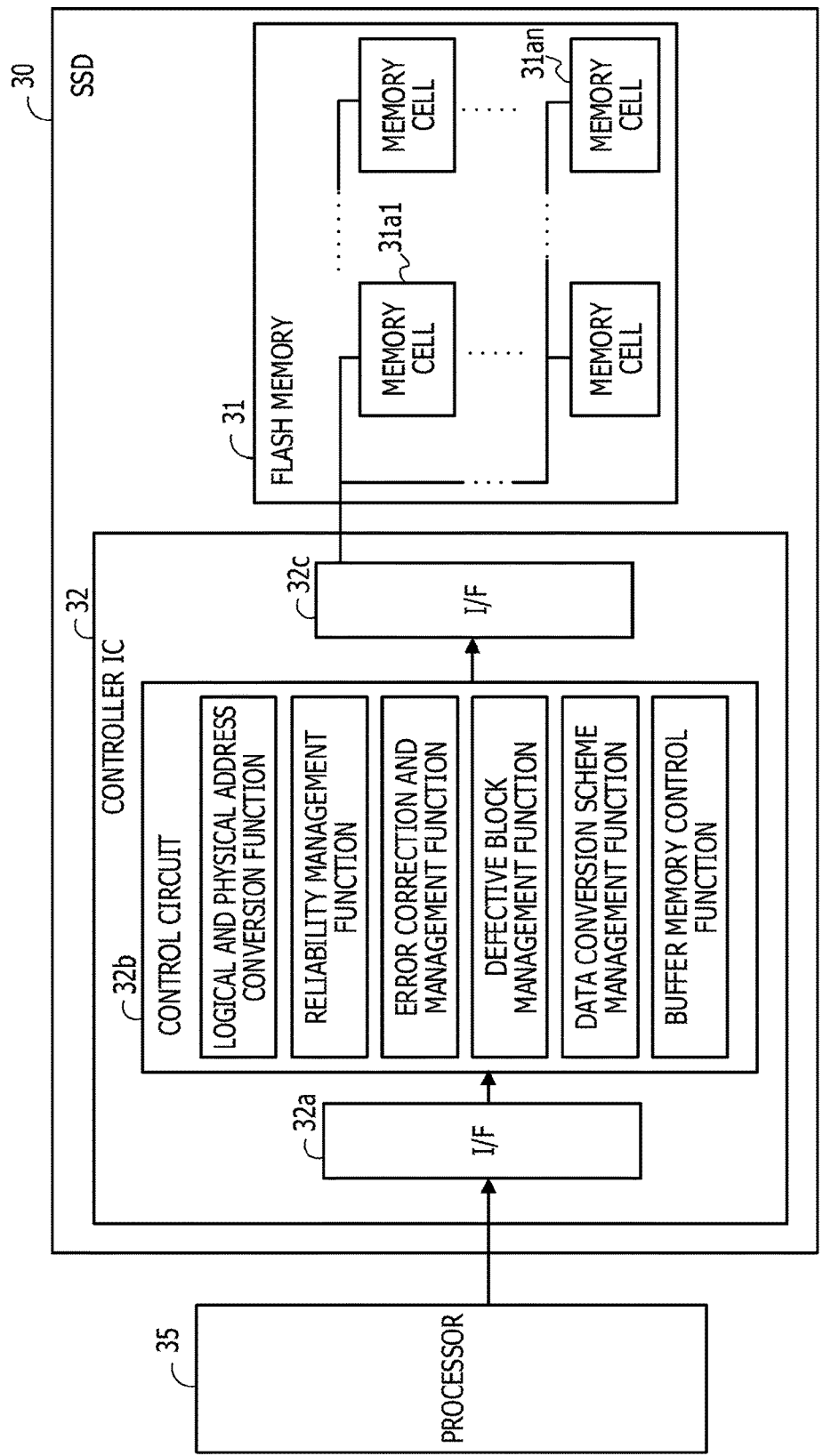
FIG. 2 is a diagram illustrating an example of an SSD.

Hereinafter, embodiments are described with reference to the accompanying drawings.

First Embodiment

FIG. 1 is a diagram illustrating an example of a memory according to a first embodiment and a memory control circuit.

A memory 10 according to the first embodiment includes a storage section 11 and a memory control circuit 12.

The storage section 11 includes multiple memory cells 11a1 to 11an. The memory cells 11a1 to 11an are nonvolatile memory cells. The nonvolatile memory cells are, for example, flash memory cells, ferroelectric random access memory (FeRAM) cells, magnetoresistive random access memory (MRAM) cells, or the like. The storage section 11 further includes a sense amplifier, a column decoder, a row decoder, and a data register, which are not illustrated in FIG. 1.

The memory control circuit 12 includes an interface (I/F) 12a, a control circuit 12b, and an I/F 12c and controls the storage section 11.

The I/F 12a is an example of an input circuit that receives various commands supplied from the control circuit 15 serving as a processor, addresses supplied from the control circuit 15, data to be written to the storage section 11, and the like. The I/F 12a supplies the aforementioned various commands, the addresses, and the data to the control circuit 12b. The I/F 12a also functions as an output circuit that receives data read from the storage section 11 and converted by the control circuit 12b in a process described later and supplies the received data to the control circuit 15.

The control circuit 12b executes, for example, various processes including a wear leveling process and a process of converting a logical address to a physical address and executes data conversion and a writing process, which are described later.

The I/F 12c functions as an output circuit that supplies a signal generated by the control circuit 12b and data generated by the control circuit 12b to the storage section 11. The I/F 12c also functions as an input circuit that receives data read from the storage section 11.

The control circuit 15 is a processor such as a central processing unit (CPU) or a digital signal processor (DSP). The control circuit 15, however, may include an application specific electronic circuit such as an application specific integrated circuit (ASIC) or a field programmable gate array (FPGA). The control circuit 12b may be a processor.

As a memory control method by the control circuit 12b, an example of the data conversion and the writing process that are executed on write data is described below.

For example, the control circuit 12b divides write data received by the I/F 12a into bit strings, each of which has a predetermined number of bits. FIG. 1 illustrates an example in which the control circuit 12b divides write data 20 into 8-bit bit strings. In the example illustrated in FIG. 1, the write data 20 is 32-bit data, and the control circuit 12b divides the write data 20 to generate 4 bit strings 21, 22, 23, and 24, for example.

Then, the control circuit 12b executes the following data conversion and the following writing process on the bit strings 21 to 24. Although a data conversion process to be executed on the bit string 21 is described below, a process that is the same as or similar to the data conversion process is executed on the other bit strings 22 to 24.

If the number of bits included in the bit string 21 and having a second logical value different from a first logical value equal to initial values stored in the memory cells 11a1 to 11an is equal to or smaller than a first threshold, the control circuit 12b associates the bit string 21 with an additional value 25a and writes the bit string 21 and the additional value 25a to the storage section 11.

In addition, if the number of bits included in the bit string 21 and having the second logical value is equal to or larger than a second threshold larger than the first threshold, the control circuit 12b generates a bit string (hereinafter referred to as reversed bit string 21a) by reversing logical values of all bits of the bit string 21. Then, the control circuit 12b associates the reversed bit string 21a with an additional value 25b and writes the reversed bit string 21a and the additional value 25b to the storage section 11.

An example described below assumes that the memory cells 11a1 to 11an are flash memory cells. If the memory cells 11a1 to 11an are flash memory cells, the first logical value that are equal to the initial values are "1", and the second logical value is "0". In addition, in the example described below, the first threshold is 2 bits, and the second threshold is 6 bits.

An example of the bit string 21 in which the number of bits having the logical value "0" is equal to or smaller than 2 is "00111111". In addition, an example of the bit string 21 in which the number of bits having the logical value "0" is equal to or larger than 6 is "00101000". An example of the reversed bit string 21a is "11010111" obtained by reversing all bits of "00101000". In this case, the number of bits having the logical value "0" is reduced to 2 from 6, which is the number of bits having the logical value "0" before the reversal.

In addition, if the number of bits included in the bit string 21 and having the logical value 0, which is the second logical value, is 3, 4, or 5, the control circuit 12b executes the following process. Examples of the bit string 21 in which the number of bits having the logical value "0" is in a range of 3 to 5 are "01101110" and "01110000".

The control circuit 12b generates a bit string (hereinafter referred to as bit string 21c after first conversion) that is a logical sum of the reversed bit string 21a and a bit string that is half of all bits of the bit string 21 and is, for example, a bit string 21b that is lower 4 bits of the bit string 21.

For example, if the bit string 21 is "01101110", the reversed bit string 21a is "10010001", the bit string 21b that is the lower bits of the bit string 21 is "1110", and the bit string 21c after the first conversion is "10011111". If the bit string 21 is "01110000", the reversed bit string 21a is "10001111", the bit string 21b that is the lower bits of the bit string 21 is "0000", and the bit string 21c after the first conversion is "10001111".

If the number of bits included in the bit string 21c after the first conversion and having the logical value "0" is equal to or smaller than 2, the control circuit 12b associates the bit string 21c after the first conversion, an additional value 25c, and a restoration code 26a with each other and writes the bit string 21c, the additional value 25c, and the restoration code 26a to the storage section 11.

For example, if the bit string 21c after the first conversion is "10011111", the number of bits included in the bit string 21c after the first conversion and having the logical value "0" is equal to or smaller than 2, and the control circuit 12b writes "10011111", the additional value 25c, and the restoration code 26a to the storage section 11. In this example, in the bit string 21c after the first conversion, the number of bits having the logical value "0" is 2 and smaller than the number of bits having the logical value "0" and included in the original bit string 21 or "01101110". The restoration code 26a is the same as the bit string 21b and is "1110", for example.

On the other hand, if the number of bits included in the bit string 21c after the first conversion and having the logical value "0" is larger than 2, the control circuit 12b executes the following process. The control circuit 12b generates a bit string (hereinafter referred to as bit string 21e after second conversion) that is a logical sum of the bit string 21 and a reversed bit string 21d of 4 bits included in the reversed bit string 21a and located at positions corresponding to the bit string 21b. If the bit string 21b is the lower 4 bits of the bit string 21, the reversed bit string 21d is lower 4 bits of the reversed bit string 21a.

For example, if the bit string 21c after the first conversion is "10001111", the number of bits included in the bit string 21 after the first conversion and having the logical value "0" is larger than 2. In this case, the control circuit 12b generates, as the bit string 21e after the second conversion, "01111111" that is a logical sum of the bit string 21 "01110000" and "1111" that is the reversed bit string 21d that is the lower 4 bits of the reversed bit string 21a "10001111", for example.

Then, the control circuit 12b associates the bit string 21e after the second conversion, an additional value 25d, and a restoration code 26b with each other and writes the bit string 21e after the second conversion, the additional value 25d, and the restoration code 26b to the storage section 11. In this example, in the bit string 21e the second conversion, the number of bits having the logical value "0" is 1 and smaller than the number of bits included in the original bit string 21 or "01110000" and having the logical value "0". The restoration code 26d is the same as the reversed bit string 21d. If the bit string 21e after the second conversion is "01111111", the restoration code 26d is "1111".

When a bit string is read from the storage section 11, the control circuit 12b detects an additional value and a restoration code that are associated with the bit string read from the storage section 11. Then, if the control circuit 12b detects the additional value 25a, the control circuit 12b outputs a read bit string without a change in the bit string. If the control circuit 12b detects the additional value 25b, the control circuit 12b reverses all bits of a read bit string and outputs a reversed bit string obtained by reversing all the bits of the read bit string.

In addition, if the control circuit 12b detects the additional value 25c, the control circuit 12b subtracts the restoration code 26a from a read bit string. Then, the control circuit 12b reverses all bits of a bit string that is the result of the subtraction. Then, the control circuit 12b outputs a reversed bit string obtained by reversing all the bits of the bit string that is the result of the subtraction. For example, if "10011111" that has been converted from the bit string 21 or "01101110" and is the bit string 21c after the first conversion is read, the restoration code 26a is "1110" and the result of the subtraction is "10010001". The result of reversing all the bits of this bit string "10010001" is "01101110", or the original bit string 21 is restored.

In addition, if the control circuit 12b detects the additional value 25d, the control circuit 12b subtracts the restoration code 26a from a read bit string and outputs a bit string that is the result of the subtraction. For example, if "01111111" that has been converted from the bit string 21 or "01110000" and is the bit string 21e after the second conversion is read, the restoration code 26b is "1111" and the result of the subtraction is "01110000". Specifically, the original bit string 21 is restored.

In the aforementioned manner, the control circuit 12b executes the process of reversing all the bits of the bit string 21 included in the write data 20 and the aforementioned two types of data conversion processes on the bit string 21 based on the number of bits that are included in the bit string 21 and different from the initial values of the memory cells 11a1 to 11an. Specifically, the control circuit 12b converts the bit string 21 to the bit string 21c after the first conversion or converts the bit string 21 to the bit string 21e after the second conversion. In the aforementioned example, in the case where the bit string 21 is to be written, the case where the reversed bit string 21a is to be written, and the case where the bit string 21c after the first conversion is to be written, the number of bits having the logical value "0" among 8 bits of each of the bit strings may be equal to or smaller than 2. In addition, in the case where the bit string 21e after the second conversion is to be written, the number of bits having the logical value "0" among the 8 bits may be equal to or smaller than 1.

Thus, the number of bits included in the write data and to be reversed from the initial values may be reduced (or the number of bits different from the initial values may be reduced) and a writing time period may be reduced, compared with a method for reversing all bits if the number of logical values different from the initial values is large.

In addition, since the writing time period is reduced due to a reduction in the number of bits to be written, the degradation of the memory cells 11a1 to 11an may be delayed and it is expected that the life of the storage section 11 is long (or the reliability of the storage section 11 is high).

The additional values 25a to 25d are used to distinguish the aforementioned 4 types of writing processes in a reading process and are, for example, 3-bit bit strings. Since the additional values 25a to 25d are written to the storage section 11, it is desirable that the number of bits included in each of the additional values 25a to 25d and having the logical value "0" be small. For example, the additional value 25a is 3 bits of "011", the additional value 25b is 3 bits of "111", the additional value 25c is 3 bits of "101", and the additional value 25d is bits of "001". Since the number of bits included in the additional value 25d and having the logical value "0" is the largest among the additional values 25a to 25d, and the number of bits included in the associated bit string 21e after the second conversion and having the logical value "0" is the smallest among the bit strings that may be written in the 4 types of writing processes, an increase in the total number of bits having the logical value "0" is suppressed.

Each of the restoration codes 26a and 26b may include the logical value "0", and 5 or 6 bits having the logical value "0" among 15 bits may be written, depending on the data pattern of the bit string 21. As described in a calculation example described later, however, the average of time periods for writing all data patterns of the write data may be reduced, compared with the method for reversing all bits if the number of logical values different from the initial values is large in the write data.

In order to associate the bit string 21 with the additional value 25a and write the bit string 21 and the additional value 25a, the control circuit 12b may cause a bit string obtained by synthesizing the bit string 21 with the additional value 25a to be stored in the storage section 11, for example. In addition, the control circuit 12b may associate the bit string 21 with the additional value 25a by associating address information items of different regions included in the storage section 11 and storing the bit string 21 and the additional value 25a with each other and managing the address information items. In the same manner, each of the additional values 25b and 25c, the restoration codes 26a and 26b, and the like is associated with a bit string (or the reversed bit string 21a, the bit string 21c after the first conversion, or the bit string 21e after the second conversion).

In the aforementioned example, the first threshold is 2 bits and the second threshold is 6 bits. The first and second thresholds, however, are not limited to this. The first threshold may be 3 bits and the second threshold may be 5 bits. In this case, the number of bits having the logical value "0" and included in an 8-bit bit string (or the reversed bit string 21a, the bit string 21c after the first conversion, or the bit string 21e after the second conversion) to be written to the storage section 11 may be equal to or smaller than 3.

In addition, in the aforementioned example, the bit string 21b is the lower 4 bits of the bit string 21, and the reversed bit string 21d is the lower 4 bits of the reversed bit string 21a. The bit string 21b and the reversed bit string 21d, however, are not limited to this. The bit string 21b may be upper 4 bits of the bit string 21, and the reversed bit string 21d may be upper 4 bits of the reversed bit string 21a. Alternatively, the bit string 21b may be arbitrary 4 bits of the bit string 21, and the reversed bit string 21d may be 4 bits included in the reversed bit string 21a and located at positions corresponding to the bit string 21b. In this case, however, the amount of information to be used to identify the positions of bits to be subtracted using the restoration codes 26a and 26b upon reading increases, compared with the case where the lower or upper 4 bits of the bit string 21 and the lower or upper 4 bits of the reversed bit string 21a are used.

In addition, in the aforementioned example, the write data 20 is divided into the 8-bit bit strings. The division, however, is not limited to this. For example, the write data 20 may be divided into 16-bit bit strings. In this case, the first threshold may be 4 bits and the second threshold may be 12 bits.

In addition, in the aforementioned example, the initial values of the memory cells 11a1 to 11an are equal to the logical value "0" but may be equal to the logical value "1".

In the aforementioned example, since not only the 8-bit bit strings but also the 3-bit additional values and the 4-bit restoration codes are written to the storage section 11, a storage region for storing the 8-bit bit strings, the 3-bit additional values, and the 4-bit restoration codes is used and larger than a storage region for storing only the 8-bit bit strings. However, while memory capacities are being increased due to high-density integration achieved by recent microfabrication techniques, three-dimensional implementation techniques, multiple bits of each memory cell, and the like, an increase in the storage region to be used may be handled.

Second Embodiment

As an example of a memory according to a second embodiment, a solid state drive (SSD) including a NAND-based flash memory is described below.

FIG. 2 is a diagram illustrating an example of the SSD.

An SSD 30 includes a NAND-based flash memory 31 and a controller integrated circuit (IC) 32.

The flash memory 31 is an example of the storage section 11 illustrated in FIG. 1, while the controller IC 32 is an example of the memory control circuit 12 illustrated in FIG. 1.

The flash memory 31 includes multiple memory cells 31a1 to 31an. The memory cells 31a1 to 31an are flash memory cells. The flash memory 31 further includes a sense amplifier, a column decoder, a row decoder, and a data register, which are not illustrated in FIG. 2.

The controller IC 32 includes an I/F 32a, a control circuit 32b, and an I/F 32c.

The I/F 32a transmits and receives various commands, addresses, or data to and from the processor 35 in accordance with various interface standards. The various interface standards are Serial Advanced Technology Attachment (ATA), Peripheral Component Interconnect Express (PCIe), Non-Volatile Memory Express (NVMe), and the like. The processor 35 and the SSD 30 that are illustrated in FIG. 2 may be installed in various electronic devices. The various electronic devices are a server, a supercomputer, a personal computer, a mobile device, a network device, a digital device, and the like.

The control circuit 32b executes a logical and physical address conversion function, a reliability management function, an error correction and management function, a defective block management function, a data conversion scheme management function, and a buffer memory control function.

The logical and physical address conversion function is a function of executing a process of converting a logical address to a physical address. The reliability management function is a function of managing the number of times that data has been deleted from each of blocks of the flash memory 31 and executing a wear leveling process to avoid the centralization of data to be rewritten to a specific block of the flash memory 31 or the like. The error correction and management function is a function of executing error checking and correction (ECC) or the like. The defective block management function is a function of executing a process of replacing a defective block with another normal block or the like. The data conversion scheme management function is a function of executing data conversion processes described later. The buffer memory control function is a function of controlling a buffer memory (not illustrated) included in the controller IC 32. The aforementioned functions may be achieved by circuits, respectively. The control circuit 32b may be a processor such as a CPU or a DSP and may achieve the aforementioned functions by executing a program stored in a read only memory (ROM) not illustrated.

The I/F 32c functions as an output circuit that supplies a signal generated by the control circuit 32b and data generated by the control circuit 32b to the flash memory 31. The I/F 32c also functions as an input circuit that receives data read from the flash memory 31.

Figure 3:
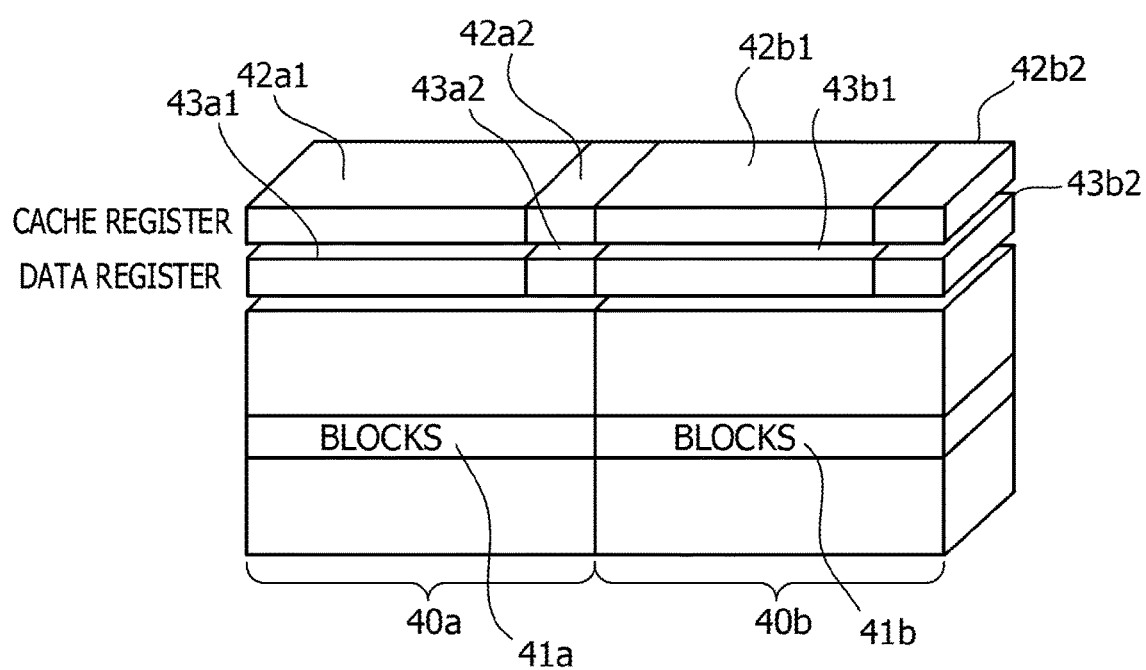
FIG. 3 is a diagram illustrating an example of a memory map of a NAND-based flash memory.

FIG. 3 is a diagram illustrating an example of a memory map of the NAND-based flash memory.

The memory map includes two planes 40a and 40b that are storage regions of the memory cells 11a1 to 11an included in the flash memory 31. Each of the planes 40a and 40b is divided into multiple blocks (for example, blocks 41a and 41b). Although not illustrated, each of the blocks is divided into multiple pages.

In addition, the memory map includes storage regions 42a1 and 42b1 of a cache register (not illustrated) included in the flash memory 31, storage regions 43a1 and 43b1 of a data register (not illustrated) included in the flash memory 31, redundant regions 42a2 and 42b2 of the cache register, and redundant regions 43a2 and 43b2 of the data register. Data for one page is held in a region obtained by combining the storage region 42a1 of the cache register with the redundant region 42a2 of the cache register, while data for one page is held in a region obtained by combining the storage region 42b1 of the cache register with the redundant region 42b2 of the cache register. Similarly, data for one page is held in a region obtained by combining the storage region 43a1 of the data register with the redundant region 43a2 of the data register, while data for one page is held in a region obtained by combining the storage region 43b1 of the data register with the redundant region 43b2 of the data register.

In the NAND-based flash memory 31, writing and reading are executed on a page basis, and deletion is executed on a block basis. For example, write data for one page is written in a page included in any of the blocks 41a of the plane 40a via the storage region 42a1 and redundant region 42a2 of the cache register and the storage region 43a1 and redundant region 43a2 of the data register. Initial values, included in the pages, of all the memory cells are equal to the logical value "1".

Next, as a memory control method by the control circuit 32b, an example of data conversion and a writing process is described.

Figure 4:
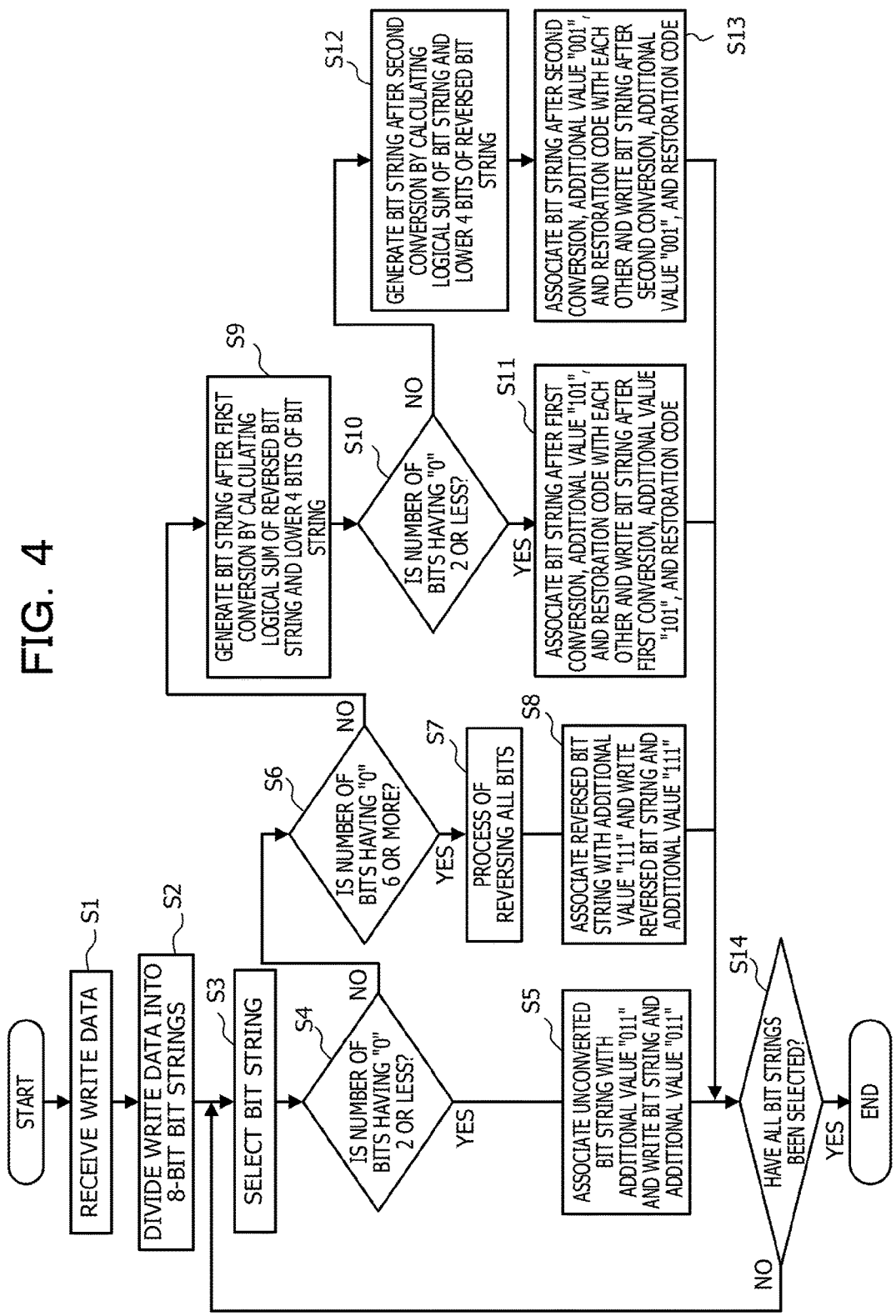
FIG. 4 is a diagram illustrating an example of data conversion and a writing process.

FIG. 4 is a diagram illustrating the example of the data conversion and the writing process.

When the I/F 32a receives write data from the processor 35 (in step S1), the control circuit 32b divides the write data into 8-bit bit strings (in step S2). Then, the control circuit 32b selects one of the multiple divided bit strings (in step S3).

After that, the control circuit 32b determines whether or not the number of bits included in the selected bit string and having the logical value "0" is equal to or smaller than 2 (in step S4). If the number of the bits included in the selected bit string and having the logical value "0" is equal to or smaller than 2, the control circuit 32b associates the unconverted bit string with the additional value "011" and writes the bit string and the additional value "011" to the flash memory 31 (in step S5).

If the number of the bits included in the selected bit string and having the logical value "0" is larger than 2, the control circuit 32b determines whether or not the number of the bits included in the selected bit string and having the logical value "0" is equal to or larger than 6 (in step S6). If the number of the bits included in the selected bit string and having the logical value "0" is equal to or larger than 6, the control circuit 32b generates a reversed bit string by reversing all bits of the selected bit string (in step S7). After that, the control circuit 32b associates the reversed bit string with the additional value "111" and writes the reversed bit string and the additional value "111" to the flash memory 31 (in step S8).

If the number of the bits included in the selected bit string and having the logical value "0" is smaller than 6, the control circuit 32b generates the reversed bit string in the same manner as the process of step S7 and generates a bit string after the first conversion by calculating a logical sum of the reversed bit string and lower 4 bits of the original bit string (in step S9). Then, the control circuit 32b determines whether or not the number of bits included in the generated bit string after the first conversion and having the logical value "0" is equal to or smaller than 2 (in step S10). If the number of the bits included in the generated bit string after the first conversion and having the logical value "0" is equal to or smaller than 2, the control circuit 32b associates the bit string after the first conversion, the additional value "101", and a restoration code (of the lower 4 bits of the bit string) with each other and writes the bit string after the first conversion, the additional value "101", and the restoration code to the flash memory 31 (in step S11).

If the number of the bits included in the generated bit string after the first conversion and having the logical value "0" is larger than 2, the control circuit 32b generates a bit string after the second conversion by calculating a logical sum of the original bit string and lower 4 bits of the reversed bit string (in step S12). Then, the control circuit 32b associates the bit string after the second conversion, the additional value "001", and a restoration code (of the lower 4 bits of the reversed bit string) with each other and writes the bit string after the second conversion, the additional value "001", and the restoration code to the flash memory 31 (in step S13).

After steps S5, S8, S11, and S13, the control circuit 32b determines whether or not all the divided bit strings have been selected (in step S14). If one or more of all the divided bit strings have yet to be selected, the control circuit 32b repeats the processes of step S3 and later. If all the divided bit strings have been selected, the control circuit 32b terminates the process.

The order of the aforementioned processes is an example and may be changed.

The additional values and the restoration codes may be written to regions corresponding to the redundant regions 42a2, 42b2, 43a2, and 43b2 and included in the pages included in the blocks 41a and 41b illustrated in FIG. 3. Alternatively, the additional values and the restoration codes may be written to regions corresponding to the storage regions 42a1, 42b1, 43a1, and 43b1 and included in the pages included in the blocks 41a and 41b illustrated in FIG. 3 after bit strings associated with the additional values and the restoration codes.

FIG. 5 is a diagram illustrating an example of the conversion processes, the additional values, the restoration codes, and the numbers of bits having the logical value 0 and included in data to be actually written, which are applied based on the numbers of bits having the logical value "0".

If the number of bits included in an 8-bit bit string obtained by the division and having the logical value "0" is in a range of 0 to 2, the bit string is not converted and is written in the same manner as the process of S5 illustrated in FIG. 4. In this case, the additional value includes 1 bit having the logical value "0", and a restoration code is not used (or all bits of a restoration code have the logical value "1"). Thus, the number of bits having the logical value "0" and included in the data (data of 8 bits, 3 bits, and 4 bits) to be actually written is equal to a value obtained by adding 1 bit to the number of the bits included in the bit string and having the logical value "0".

If the number of bits included in the 8-bit bit string and having the logical value "0" is in a range of 6 to 8, a reversed bit string obtained by reversing all the bits of the bit string is written in the same manner as the processes of steps S7 and S8 illustrated in FIG. 4. The number of bits having the logical value "0" and included in the reversed bit string obtained by reversing all the bits is in a range of 0 to 2. In this case, the additional value does not include the logical value "0" and a restoration code is not used (or all bits of a restoration code have the logical value "1"). Thus, the number of bits having the logical value "0" and included in the data to be actually written is in the range of 0 to 2.

If the number of bits included in the 8-bit bit string and having the logical value "0" is in a range of 3 to 5, the original bit string is converted to a logical sum of the reversed bit string and lower 4 bits of the original bit string (or a bit string after the first conversion is generated). If the number of bits included in the bit string after the first conversion and having the logical value "0" is equal to or smaller than 2, the bit string after the first conversion is written in the same manner as the process of step S11. The additional value used in the case where this first conversion process is applied includes 1 bit having the logical value "0".

The number of bits having the logical value "0" and included in data to be actually written or the number of the bits having the logical value "0" and included in the bit string after the first conversion, the additional value, and the lower 4 bits, serving as a restoration code, of the original bit string is equal to or smaller than 6.

If the number of bits included in the bit string after the first conversion and having the logical value "0" is larger than 2, the original bit string is converted to a logical sum of the original bit string and lower 4 bits of the reversed bit string (or a bit string after the aforementioned second conversion is generated) in the same manner as the process of step S12 illustrated in FIG. 4. Then, the bit string after the second conversion is written in the same manner as the process of step S13. The number of bits included in the bit string after the second conversion and having the logical value "0" is equal to or smaller than 1. The additional value used in the case where this second conversion process is applied includes 2 bits having the logical value "0". The number of bits having the logical value "0" and included in data to be actually written or the number of the bits having the logical value "0" and included in the bit string after the second conversion, the additional value, and the lower 4 bits, serving as the restoration code, of the original bit string is equal to or smaller than 5.

As illustrated in FIG. 5, if the number of bits included in the original bit string and having the logical value "0" is in the range of 3 to 5, the number of bits having the logical value "0" and included in data to be actually written may be 5 or 6, depending on a restoration code. However, when all data patterns (256 data patterns) of the 8-bit bit string are considered, the ratio (hereinafter merely referred to as ratio) of the number of bits having the logical value "0" and included in data to be actually written to the flash memory 31 to the number of all bits of the data to be actually written to the flash memory 31 may be reduced, compared with the method for reversing all the bits of the bit string if the number of bits having the logical value "0" and included in the bit string is larger than the number of bits having the logical value "1" and included in the bit string. Thus, the average writing time period may be reduced, compared with the method for reversing all bits of a bit string if the number of bits having the logical value "0" and included in the bit string is larger than the number of bits having the logical value "1" and included in the bit string. An example of the calculation of the average writing time period is described below.

Example of Calculation of Writing Time Period

FIG. 6 is a diagram illustrating an example of the number of bits having the logical value "0" and included in data to be actually written after a conversion process and the result of calculating the ratio of the number of the bits having the logical value "0" and included in the data to the number of all bits of the data for each of all data patterns of an 8-bit bit string.

For example, if the original bit string is "00000001", a bit string to be written to the flash memory 31 by the process of step S7 illustrated in FIG. 4 is "11111110". Since an additional value and a restoration code do not include the logical value "0", the number of bits having the logical value "0" and included in the data to be written to the flash memory 31 is 1. The ratio of the number of bits having the logical value "0" and included in 15 bits of the bit string to be written to the flash memory 31, the additional value to be written to the flash memory 31, and the restoration code to be written to the flash memory 31 to the number of all the bits to be written to the flash memory 31 is 1/15=0.067.

The number of data patterns that are among all the 256 data patterns and in which the number of bits having the logical value "0" and included in 15 bits of data to be actually written is 0 and the aforementioned ratio is 0/15=0.000 is 1. In addition, the number of data patterns that are among the 256 data patterns and in which the number of bits having the logical value "0" and included in 15 bits of data to be actually written is 1 and the aforementioned ratio is 1/15=0.067 is 10. The number of data patterns that are among the 256 data patterns and in which the number of bits having the logical value "0" and included in 15 bits of data to be actually written is 2 and the aforementioned ratio is 2/15=0.133 is 45. In addition, the number of data patterns that are among the 256 data patterns and in which the number of bits having the logical value "0" and included in 15 bits of data to be actually written is 3 and the aforementioned ratio is 3/15=0.200 is 52. The number of data patterns that are among the 256 data patterns and in which the number of bits having the logical value "0" and included in 15 bits of data to be actually written is 4 and the aforementioned ratio is 4/15=0.267 is 64. In addition, the number of data patterns that are among the 256 data patterns and in which the number of bits having the logical value "0" and included in 15 bits of data to be actually written is 5 and the aforementioned ratio is 5/15=0.333 is 60. The number of data patterns that are among the 256 data patterns and in which the number of bits having the logical value "0" and included in 15 bits of data to be actually written is 6 and the aforementioned ratio is 6/15=0.400 is 24.

If each relative writing time period is represented as a product of the ratio and the number of patterns that achieve the ratio, a relative time period for writing a data pattern in which the number of bits having the logical value "0" and included in 15 bits of data to be actually written is 0 is 0.000×1=0. In addition, a relative time period for writing data patterns in which the number of bits having the logical value "0" and included in 15 bits of data to be actually written is 1 is 0.067×10=0.667. A relative time period for writing data patterns in which the number of bits having the logical value "0" and included in 15 bits of data to be actually written is 2 is 0.133×45=6. In addition, a relative time period for writing data patterns in which the number of bits having the logical value "0" and included in 15 bits of data to be actually written is 3 is 0.200×52=10.4. A relative time period for writing data patterns in which the number of bits having the logical value "0" and included in 15 bits of data to be actually written is 4 is 0.267×64=17.067. In addition, a relative time period for writing data patterns in which the number of bits having the logical value "0" and included in 15 bits of data to be actually written is 5 is 0.333×60=20. A relative time period for writing data patterns in which the number of bits having the logical value "0" and included in 15 bits of data to be actually written is 6 is 0.400×24=9.6.

Thus, if all the data patterns are evenly generated (or if the write data is random data), an average relative writing time period is (0+0.667+6+10.4+17.067+20+9.6)/256=0.249.

An average relative writing time period is calculated in the following manner if the number of bits included in an 8-bit bit string and having the logical value "0" is equal to or smaller than 4, the bit string is not converted, an additional value "1" is added, and the bit string and the additional value "1" are written, and if the number of bits included in the 8-bit bit string and having the logical value "0" is larger than 4, an additional value "0" is added, and a reversed bit string obtained by reversing all bits of the 8 bit string and the additional value "0" are written. In this case, the additional values indicate whether all the bits of the bit string have been reversed.

The number of data patterns that are among the 256 data patterns and in which the number of bits having the logical value "0" and included in 9 bits (8 bits of the bit string and 1 bit of an additional value) of data to be actually written is 0 and the aforementioned ratio is 0/9=0.000 is 1. The number of data patterns that are among the 256 data patterns and in which the number of bits having the logical value "0" and included in 9 bits of data to be actually written is 1 and the aforementioned ratio is 1/9=0.111 is 9. The number of data patterns that are among the 256 data patterns and in which the number of bits having the logical value "0" and included in 9 bits of data to be actually written is 2 and the aforementioned ratio is 2/9=0.222 is 36. The number of data patterns that are among the 256 data patterns and in which the number of bits having the logical value "0" and included in 9 bits of data to be actually written is 3 and the aforementioned ratio is 3/9=0.333 is 84. The number of data patterns that are among the 256 data patterns and in which the number of bits having the logical value "0" and included in 9 bits of data to be actually written is 4 and the aforementioned ratio is 4/9=0.444 is 126.

If each relative writing time period is represented as a product of the ratio and the number of patterns that achieve the ratio, a relative time period for writing a data pattern in which the number of bits having the logical value "0" and included in 9 bits of data to be actually written is 0 is 0.000×1=0. In addition, a relative time period for writing data patterns in which the number of bits having the logical value "0" and included in 9 bits of data to be actually written is 1 is 0.111×9=1. A relative time period for writing data patterns in which the number of bits having the logical value "0" and included in 9 bits of data to be actually written is 2 is 0.222×36=8. In addition, a relative time period for writing data patterns in which the number of bits having the logical value "0" and included in 9 bits of data to be actually written is 3 is 0.333×84=28. A relative time period for writing data patterns in which the number of bits having the logical value "0" and included in 9 bits of data to be actually written is 4 is 0.444×126=56. Thus, if all the data patterns are evenly generated (or if the write data is random data), an average relative writing time period is (0+1+8+28+56)/256=0.363.

If the relative writing time period is 1, the average relative time period for writing data in the data conversion and the writing process that are described with reference to FIG. 4 is 0.249/0.363=0.685. Specifically, In the data conversion and the writing process that are described with reference to FIG. 4, if the number of bits having the logical value "0" is larger than the number of bits having the logical value "1", it is expected that a writing time period is reduced by approximately 31%, compared with the method for reversing all bits.

In addition, since the writing time period is reduced by reducing the number of bits to be written, the degradation of insulating layers of the memory cells 31a1 to 31an may be delayed and it is expected that the life of the flash memory 31 is long (or the reliability of the flash memory 31 is high).

The additional values are not limited to the values described in the example. For example, even if the following additional values are used, the same effect may be obtained.

FIG. 7 is a diagram illustrating an example of multiple combinations able to be used as additional values.

FIG. 7 illustrates combinations of additional values to be used in processes 1 to 4. The process 1 indicates the process of step S5 illustrated in FIG. 4. The process 2 indicates the process of step S8 illustrated in FIG. 4. The process 3 indicates the process of step S11 illustrated in FIG. 4. The process 4 indicates the process of step S13 illustrated in FIG. 4.

Four additional values of a combination No. 1 are the same as the additional values described in the example. A combination other than the combinations illustrated in FIG. 7 may be used as long as the processes 1 to 4 are distinguished by additional values of the combination, the number of bits having the logical value "0" and included in each of additional values used for the processes 1 and 3 is 1, the number of bits having the logical value "0" and included in an additional value used for the process 2 is 0, and the number of bits having the logical value "0" and included in an additional value used for the process 4 is 2.

Each of the additional values may have 4 bits or more. In this case, the number of bits included in each of the additional values and having the logical value "0" may be equal to or smaller than 1.

In a reading process, the original bit strings may be restored by the same processes as described in the first embodiment using the aforementioned additional values and the aforementioned restoration codes.

The lower 4 bits of the bit string are used in the process of step S9 illustrated in FIG. 4, while the lower 4 bits of the reversed bit string are used in the process of step S12. The processes of steps S9 and S12, however, are not limited to this. Upper 4 bits of the bit string and upper 4 bits of the reversed bit string may be used.

Figure 8:
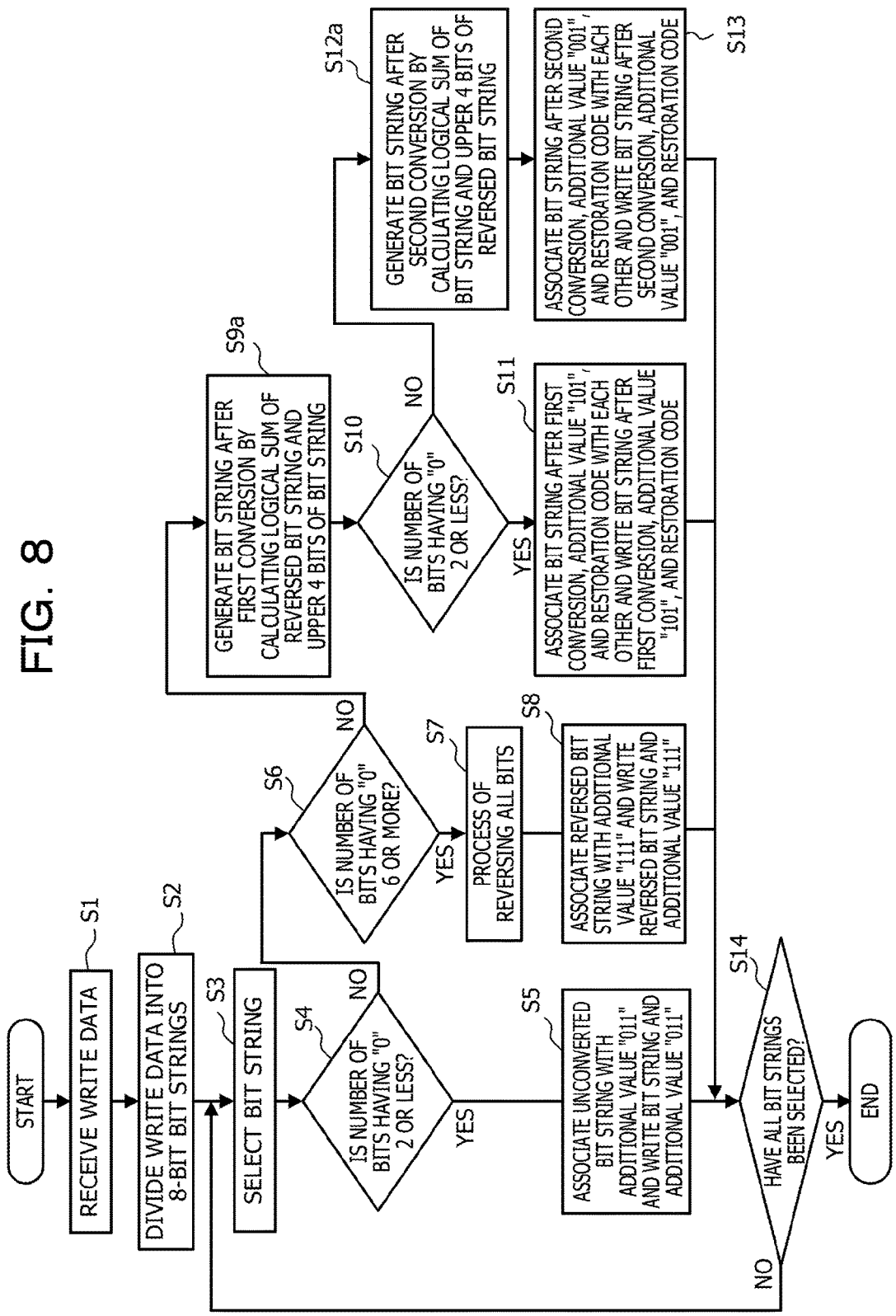
FIG. 8 is a diagram illustrating another example of the data conversion and the writing process.

FIG. 8 is a diagram illustrating another example of the data conversion and the writing process.

The control circuit 32b executes a process of step S9a to generate a bit string after the first conversion by calculating a logical sum of the reversed bit string and the upper 4 bits of the bit string, instead of the process of step S9 illustrated in FIG. 4. In addition, the control circuit 32b executes a process of step S12a to generate a bit string after the second conversion by calculating a logical sum of the bit string and the upper 4 bits of the reversed bit string, instead of the process of step S12 illustrated in FIG. 4.

In this case, a restoration code used in the process of step S11 is the upper 4 bits of the bit string, and a restoration code used in the process of step S13 is the upper 4 bits of the reversed bit string. Other processes are the same as those illustrated in FIG. 4.

The average relative writing time period in the case where the data conversion and the writing process that are described with reference to FIG. 8 are executed is 0.249, and an effect that is the same as or similar to that obtained by the data conversion and the writing process that are described with reference to FIG. 4 is obtained by the data conversion and the writing process that are described with reference to FIG. 8.

Although the examples described with reference to FIGS. 4 and 8 describe the case where 8-bit bit strings are used. The processes described with reference to FIGS. 4 and 8 are not limited to this. For example, 16-bit bit strings may be used.

Figure 9:
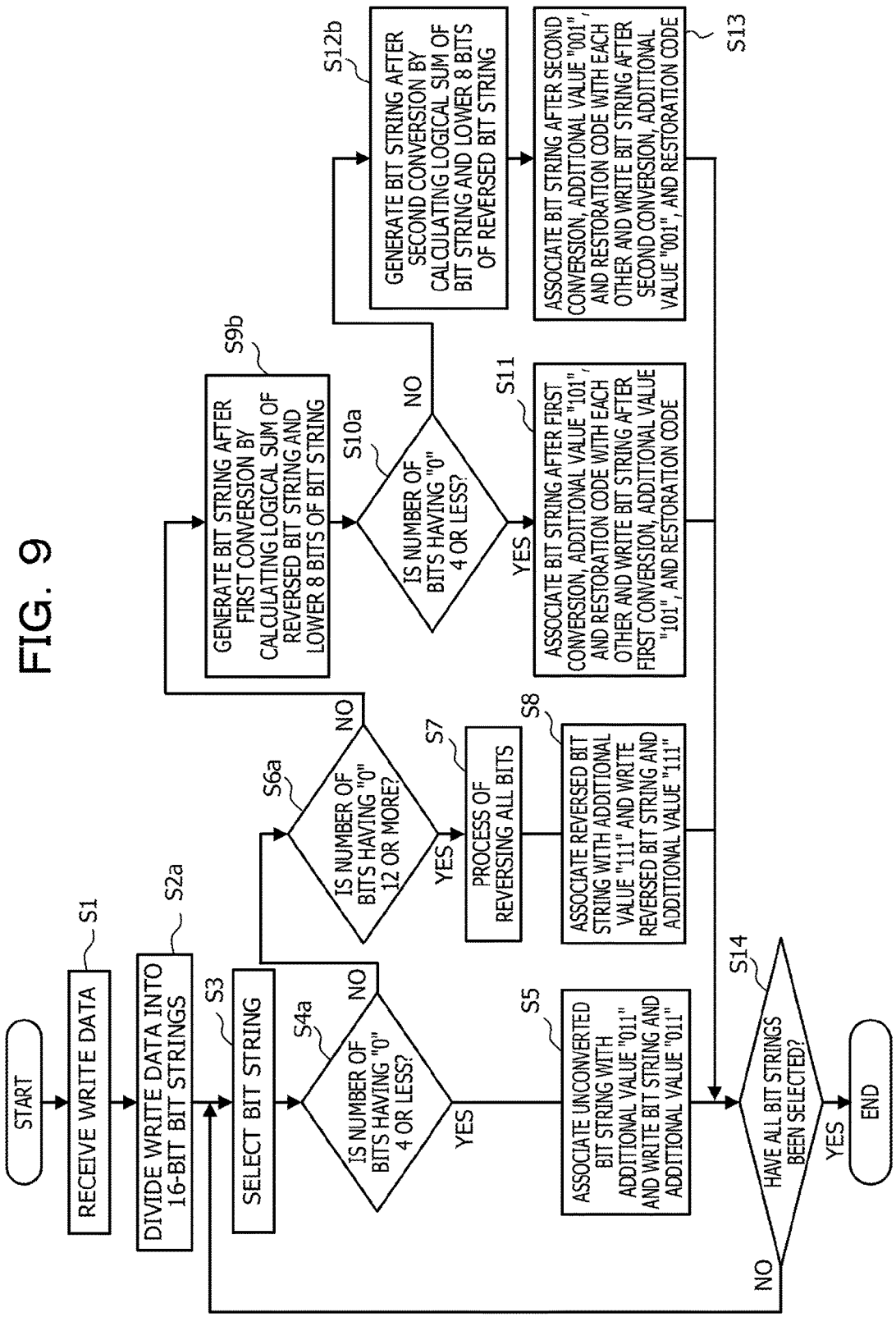
FIG. 9 is a diagram illustrating an example of data conversion and a writing process in the case where 16-bit bit strings are used.

FIG. 9 is a diagram illustrating an example of data conversion and a writing process that are executed in the case where 16-bit bit strings are used.

The control circuit 32b executes a process of step S2a to divide write data into 16-bit bit strings, instead of the process of step S2 illustrated in FIG. 4. In addition, the control circuit 32b executes a process of step S4a to determine whether or not the number of bits having the logical value "0" and included in a selected 16-bit bit string is equal to or smaller than 4, instead of the process of step S4 illustrated in FIG. 4. In addition, the control circuit 32b executes a process of step S6a to determine whether or not the number of bits having the logical value "0" and included in the selected 16-bit bit string is equal to or larger than 12, instead of the process of step S6 illustrated in FIG. 4. Furthermore, the control circuit 32b executes a process of step S9b to generate a bit string after the first conversion by calculating a logical sum of lower 8 bits of the selected 16-bit bit string and a reversed bit string obtained by reversing all bits of the selected 16-bit bit string, instead of the process of step S9 illustrated in FIG. 4. In addition, the control circuit 32b executes a process of step S10a to determine whether or not the number of bits having the logical value "0" and included in the bit string after the first conversion is equal to or smaller than 4, in stead of the process of step S10 illustrated in FIG. 4. In addition, the control circuit 32b executes a process of step S12b to generate a bit string after the second conversion by calculating a logical sum of the bit string and lower 8 bits of the reversed bit string, in stead of the process of step S12.

A restoration code used in the process of step S11 is the lower 8 bits of the bit string, while a restoration code used in the process of step S13 is the lower 8 bits of the reversed bit string. Other processes are the same as those described with reference to FIG. 4.

In the process of step S9b, the control circuit 32b may generate a bit string after the first conversion by calculating a logical sum of the reversed bit string and upper 8 bits of the bit string. In this case, in the process of step S12b, the control circuit 32b generates a bit string after the second conversion by calculating a logical sum of the bit string and upper 8 bits of the reversed bit string. In addition, in this case, a restoration code used in the process of step S11 is the upper 8 bits of the bit string, while a restoration code used in the process of step S13 is the upper 8 bits of the reversed bit string.

The number of all data patterns of a 16-bit bit string is 65536. An average relative writing time period in the case where the data conversion and the writing process that are described with reference to FIG. 9 are executed is calculated to be 0.291 by the same calculation method as that used in the case where 8-bit bit strings are used. If the number of bits having the logical value "0" and included in a 16-bit bit string is equal to or smaller than 8, the bit string is not converted, the additional value "1" is added, and the bit string and the additional value are written. If the number of bits having the logical value "0" and included in the 16-bit bit string is larger than 8, the additional value "0" is added, and a bit string obtained by reversing all bits of the bit string, and the additional value are written. In this case, an average relative writing time period is 0.402.

Thus, if the data conversion and the writing process that are described with reference to FIG. 9 are executed, and it is expected that a writing time period is reduced, compared with the method for reversing all bits if the number of bits having the logical value "0" is larger than the number of bits having the logical value "1".

The aforementioned data conversion processes may be executed by the processor 35 that is an external control circuit of the SSD 30, instead of the control circuit 32b of the controller IC 32.

Figure 10:
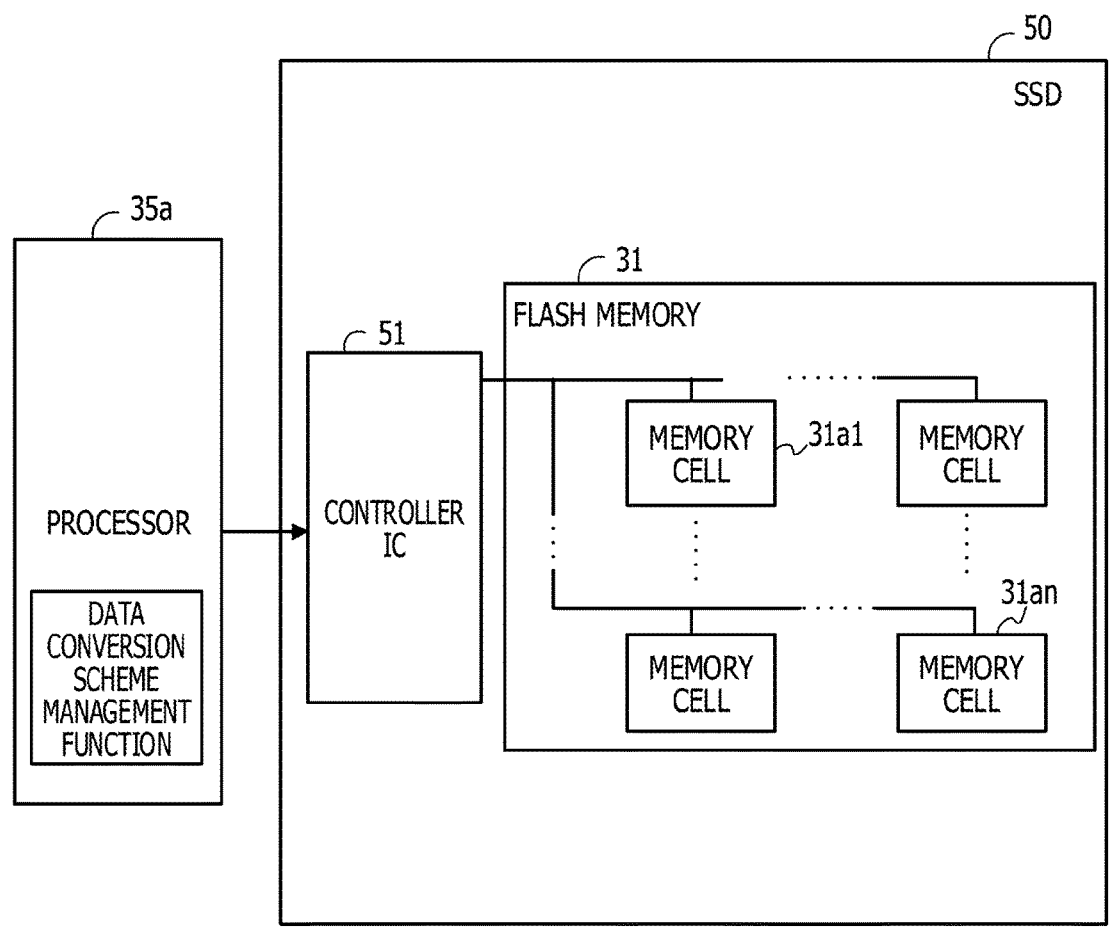
FIG. 10 is a diagram illustrating an example in which a processor installed outside an SSD executes a data conversion process.

FIG. 10 is a diagram illustrating an example in which the processor installed outside the SSD executes a data conversion process.

A controller IC 51 included in an SSD 50 does not have the data conversion scheme management function, and a processor 35a connected to the SSD 50 executes the data conversion scheme management function. Specifically, the processor 35a may execute the process illustrated in FIG. 4, 8, or 9 by executing a program stored in the flash memory 31 or another memory.

In the example illustrated in FIG. 10, the processor 35a writes processed bit strings to the flash memory 31 via the controller IC 51, but is not limited to this.

Figure 11:
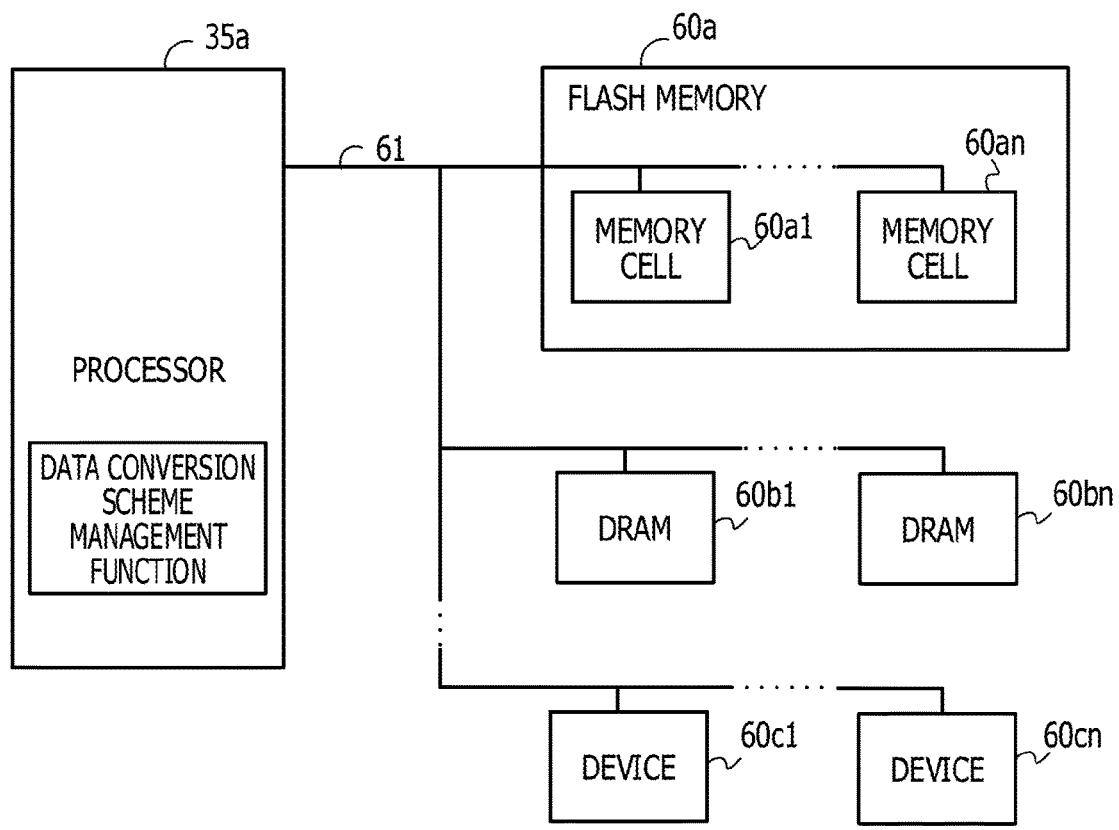
FIG. 11 is a diagram illustrating an example in which the processor writes data directly to memory cells.

FIG. 11 is a diagram illustrating an example in which the processor writes data directly to memory cells.

FIG. 11 illustrates an example in which the processor 35a, a flash memory 60a having memory cells 60a1 to 60an, dynamic random access memories (DRAMs) 60b1 to 60bn, and other devices 60c1 to 60cn are connected to a bus 61.

The processor 35a may write bit strings converted by the process illustrated in FIG. 4, 8, or 9, additional values, and restoration codes directly to the memory cells 60a1 to 60an via the bus 61.

The flash memories 31 and 60a are used in the aforementioned examples. The memories, however, are not limited to this. Another nonvolatile memory in which a writing time period depends on the number of bits to be reversed from initial values of memory cells may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory control circuit comprising:
an input circuit that receives data to be written to a storage having multiple nonvolatile memory cells; and
a control circuit that associates, when a second number of bits that are included in a first bit string included in the data and having a first number of bits and have a second logical value different from a first logical value equal to initial values stored in the multiple nonvolatile memory cells is equal to or smaller than a first threshold, the first bit string with a first additional value and writes the first bit string and the first additional value to the storage, that associates, when the second number of the bits is larger than a second threshold larger than the first threshold, a second bit string obtained by reversing logical values of all the bits of the first bit string with a second additional value and writes the second bit string and the second additional value to the storage, that generates, when the second number of the bits is larger than the first threshold and smaller than the second threshold, a fourth bit string by calculating a logical sum of the second bit string and a third bit string having half of all the bits of the first bit string, that associates, when a third number of bits included in the fourth bit string and having the second logical value is equal to or smaller than the first threshold, the fourth bit string, a third additional value, and the third bit string with each other and writes the fourth bit string, the third additional value, and the third bit string to the storage, that generates, when the third number of the bits is larger than the first threshold, a sixth bit string by calculating a logical sum of the first bit string and a fifth bit string having bits included in the second bit string and located at positions corresponding to the third bit string, and that associates the sixth bit string, a fourth additional value, and the fifth bit string with each other and writes the sixth bit string, the fourth additional value, and the fifth bit string to the storage.

2. The memory control circuit according to claim 1, wherein the first additional value, the second additional value, the third additional value, and the fourth additional value are different 3-bit values, and the number of bits included in the fourth additional value and having the second logical value is the largest among the first additional value, the second additional value, the third additional value, and the fourth additional value.

3. The memory control circuit according to claim 1, wherein the third bit string is a bit string of lower half bits of the first bit string, and the fifth bit string is a bit string of lower half bits of the second bit string.

4. The memory control circuit according to claim 1, wherein the third bit string is a bit string of upper half bits of the first bit string, and the fifth bit string is a bit string of upper half bits of the second bit string.

5. The memory control circuit according to claim 1, wherein when the first number of the bits is 8 bits, the first threshold is 2 bits and the second threshold is 6 bits.

6. The memory control circuit according to claim 1, wherein when the first number of the bits is 16 bits, the first threshold is 4 bits and the second threshold is 12 bits.

7. The memory control circuit according to claim 1, wherein the multiple nonvolatile memory cells are flash memory cells in which the first logical value is 1.

8. A memory comprising:
an input circuit that receives data to be written to a storage having multiple nonvolatile memory cells; and
a control circuit that associates, when a second number of bits that are included in a first bit string included in the data and having a first number of bits and have a second logical value different from a first logical value equal to initial values stored in the multiple nonvolatile memory cells is equal to or smaller than a first threshold, the first bit string with a first additional value and writes the first bit string and the first additional value to the storage, that associates, when the second number of the bits is larger than a second threshold larger than the first threshold, a second bit string obtained by reversing logical values of all the bits of the first bit string with a second additional value and writes the second bit string and the second additional value to the storage, that generates, when the second number of the bits is larger than the first threshold and smaller than the second threshold, a fourth bit string by calculating a logical sum of the second bit string and a third bit string having half of all the bits of the first bit string, that associates, when a third number of bits included in the fourth bit string and having the second logical value is equal to or smaller than the first threshold, the fourth bit string, a third additional value, and the third bit string with each other and writes the fourth bit string, the third additional value, and the third bit string to the storage, that generates, when the third number of the bits is larger than the first threshold, a sixth bit string by calculating a logical sum of the first bit string and a fifth bit string having bits included in the second bit string and located at positions corresponding to the third bit string, and that associates the sixth bit string, a fourth additional value, and the fifth bit string with each other and writes the sixth bit string, the fourth additional value, and the fifth bit string to the storage.

9. A memory control method for causing a control circuit to execute a process, the process comprising:
associating, when a second number of bits that are included in a first bit string having a first number of bits and included in data to be written to a storage having multiple nonvolatile memory cells and have a second logical value different from a first logical value equal to initial values stored in the multiple nonvolatile memory cells is equal to or smaller than a first threshold, the first bit string with a first additional value and writing the first bit string and the first additional value to the storage;
associating, when the second number of the bits is larger than a second threshold larger than the first threshold, a second bit string obtained by reversing logical values of all the bits of the first bit string with a second additional value and writing the second bit string and the second additional value to the storage;
generating, when the second number of the bits is larger than the first threshold and smaller than the second threshold, a fourth bit string by calculating a logical sum of the second bit string and a third bit string having half of all the bits of the first bit string, and associating, when a third number of bits included in the fourth bit string and having the second logical value is equal to or smaller than the first threshold, the fourth bit string, a third additional value, and the third bit string with each other and writing the fourth bit string, the third additional value, and the third bit string to the storage;
generating, when the third number of the bits is larger than the first threshold, a sixth bit string by calculating a logical sum of the first bit string and a fifth bit string having bits included in the second bit string and located at positions corresponding to the third bit string, and associating the sixth bit string, a fourth additional value, and the fifth bit string with each other and writing the sixth bit string, the fourth additional value, and the fifth bit string to the storage.

* * * * *